United States Patent
Pilling et al.

(10) Patent No.: US 7,586,343 B2
(45) Date of Patent: *Sep. 8, 2009

(54) OUTPUT DRIVE CIRCUIT THAT ACCOMMODATES VARIABLE SUPPLY VOLTAGES

(75) Inventors: David Pilling, Los Altos Hills, CA (US); Kar-chung Leo Lee, San Jose, CA (US); Mario Fulam Au, Fremont, CA (US)

(73) Assignee: Integrated Device Technology, Inc, San Jose, CA (US)

( * ) Notice: Subject to any disclaimer, the term of this patent is extended or adjusted under 35 U.S.C. 154(b) by 57 days.

This patent is subject to a terminal disclaimer.

(21) Appl. No.: 11/800,438

(22) Filed: May 4, 2007

(65) Prior Publication Data

US 2007/0285135 A1   Dec. 13, 2007

(51) Int. Cl.
*H03B 1/10* (2006.01)
*H03K 3/00* (2006.01)

(52) U.S. Cl. .................................. 327/112; 326/81
(58) Field of Classification Search ............ 327/108, 327/112, 333; 326/81, 83, 86
See application file for complete search history.

(56) References Cited

U.S. PATENT DOCUMENTS

| | | | |
|---|---|---|---|
| 5,834,948 A | 11/1998 | Yoshizaki et al. | |
| 5,933,025 A | 8/1999 | Nance et al. | |
| 6,064,227 A | 5/2000 | Saito | |
| 6,268,744 B1 | 7/2001 | Drapkin et al. | |
| 6,282,146 B1 | 8/2001 | Guo et al. | |
| 6,388,499 B1 | 5/2002 | Tien et al. | |
| 6,407,579 B1 * | 6/2002 | Goswick | 326/81 |
| 7,224,195 B2 | 5/2007 | Pilling et al. | |
| 2002/0153935 A1 | 10/2002 | Drapkin et al. | |

FOREIGN PATENT DOCUMENTS

| | | |
|---|---|---|
| DE | 11 2004 002 449 T2 | 10/2006 |
| WO | WO 2005/062468 A2 | 7/2005 |
| WO | WO 2005/062468 A3 | 7/2005 |

OTHER PUBLICATIONS

International Preliminary Report on Patentability and Written Opinion mailed Jun. 22, 2006, in counterpart PCT Application No. PCT/US2004/038239.
Examination Report received in U.K. Application No. GB0611457.3 dated Dec. 8, 2006.
Response to Examination Report filed Jun. 7, 2007 in U.K. Application No. GB0611457.3.
Notification of Grant dated Jul. 10, 2007, in U.K. Application No. GB0611457.3.

* cited by examiner

*Primary Examiner*—Quan Tra
(74) *Attorney, Agent, or Firm*—Finnegan Henderson, et al

(57) ABSTRACT

In accordance with the invention, a driver circuit is described that permits a single thin gate oxide process to be utilized where a dual oxide process may normally be necessary. Circuits employing only thin gate oxide devices are used as the design basis for a single product with a single set of tooling and manufacturing process to operate within the same timing specifications for a core voltage output drive as well as for a higher system drive.

4 Claims, 10 Drawing Sheets

OUTPUT DRIVE CIRCUIT THAT ACCOMMODATES VARIABLE SUPPLY VOLTAGES

RELATED APPLICATIONS

The present application is related to and claims priority from U.S. Provisional Application 60/529,411, "Output Drive Circuit Which Tolerates Variable Supply Voltages," filed on Dec. 11, 2003, by David Pilling, Leo Lee, and Mario Au, which is herein incorporated by reference in its entirety.

BACKGROUND

1. Field of the Invention

The present invention relates to an output controller and, in particular, an output driver that accommodates variable supply voltages.

2. Discussion of Related Art

Circuit development is often a result of technological change. In the 1960's the N-channel MOS gate oxide thicknesses were about 2000 Å in order to support gate bias potentials of about 18 volts. In the last ten years, products that were designed with 130 Å thick gates for five volt supplies are now designed for operating supply voltages of 3.3 volts with core supplies of 2.5 volts. More recent designs with core voltages of 1.0 volts have 3.3 volt external drives with gate oxides of core transistors of 16 Å gate thicknesses. These later reductions to one volt supply designs now require the added expense of a dual oxide process, for example an 80 Å process for device potentials of 3.3 volts and a 16 Å process for device potentials of 1.0 volts. The lower device potentials can result in lower power consumption.

Further, many devices still utilize a higher voltage power supply, even when some of the integrated circuits are formed with thinner gate oxides (and therefore are designed for lower voltage applications). Application of voltages greater than the design specification for a particular gate oxide thickness can result in damage to the transistor. Further, application of high voltage power supplies in circuits that are formed with lower voltage transistors can affect the timing of those circuits.

Therefore, there is a need to reduce the cost of processing for two gate oxide thicknesses and to allow for external power supply voltages that operate at either a high voltage or a low voltage.

SUMMARY

In accordance with the invention, a driver circuit is described that permits a single thin gate oxide process to be utilized where a dual oxide process may normally be necessary. Circuits employing only thin gate oxide devices are used as the design basis for a single product with a single set of tooling and manufacturing process to operate within the same timing specifications for a core voltage output drive as well as for a higher system drive.

Some embodiments of an output driver circuit according to the present invention include a first transistor coupled between a power supply voltage and an output pad; a second transistor coupled between the first transistor and the output pad; a level shifter coupled between the first transistor and an input signal, the level shifter providing a signal to a gate of the first transistor; and a control circuit coupled to a gate of the second transistor, the control circuit providing a signal to the gate of the second transistor in response to the input signal and a supply voltage control signal. The level shifter and the control circuit are coupled to a voltage that is set to ground when the supply voltage control signal indicates a low supply voltage and is set to an intermediate voltage when the supply voltage control signal indicates a high supply voltage. In such an arrangement, the voltages applied across a gate oxide of the first transistor and a gate oxide of the second transistor do not exceed the low supply voltage. In some embodiments, a one-shot can be coupled to the voltage to momentarily ground the voltage in order to increase the charging rate of the output pad when the supply voltage control signal indicates the high supply voltage.

A method of driving an output voltage according to some embodiments of the present invention includes providing a voltage to a level shifter, the voltage being an intermediate voltage when a high voltage is applied and the voltage being a ground voltage when a low voltage is applied and applying the voltage to a gate of a first transistor to turn the first transistor on when charging an output pad. In some embodiments, a further step of momentarily grounding the voltage in a transition of an input voltage from low to high can be performed.

It is to be understood that both the foregoing general description and the following detailed description are exemplary and explanatory only and are not restrictive of the invention, as claimed. These and other embodiments are further described below with reference to the following figures.

In the figures, elements having the same designation have the same or similar function.

DETAILED DESCRIPTION

In accordance with the present invention, a driver circuit is presented that can operate with a low supply voltage or a high supply voltage. The transistors of the circuit can withstand application of the low supply voltage but may be damaged by direct application of the high supply voltage.

Figure 1B:
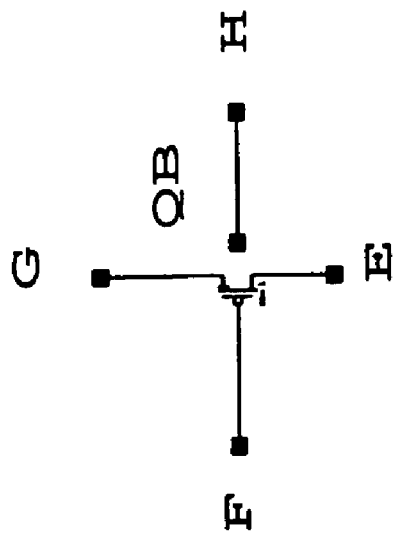
FIGS. 1A and 1B illustrate transistor structures.
Figure 1A:
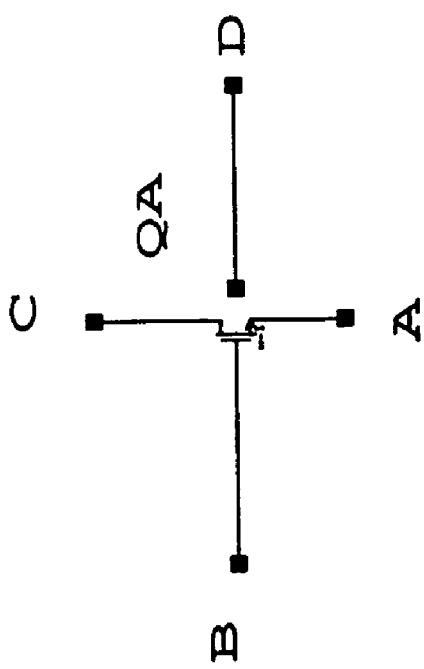

Embodiments of a driver circuit according to the present invention can meet at least two design objectives. First, the transistors processed with thin gate oxides should not exceed specified design limits in the high voltage environment (i.e., upon application of the high voltage power supply). Second, the delays of the circuit should be the same for both high and low voltage output drivers. FIGS. 1A and 1B illustrate the first design objective. FIG. 1A illustrates an N-channel transistor where the labels A, B, C, and D denote the source, gate, drain, and substrate nodes, respectively. FIG. 1B illustrates a P-channel transistor where E, F, G, and H denote the source, gate, drain, and substrate, respectively. The voltages between the gate and the source, the drain, or the substrate nodes, for example, should not exceed the specified device limits or damage to the transistor may result. In some embodiments of the invention, for example, voltages applied to the transistors shown in FIGS. 1A and 1B can not exceed a low voltage (e.g., 2.5 V) without damaging the transistor. However, in some applications a high voltage (e.g., 3.3 V) power supply is utilized as a drive voltage.

Figure 2:
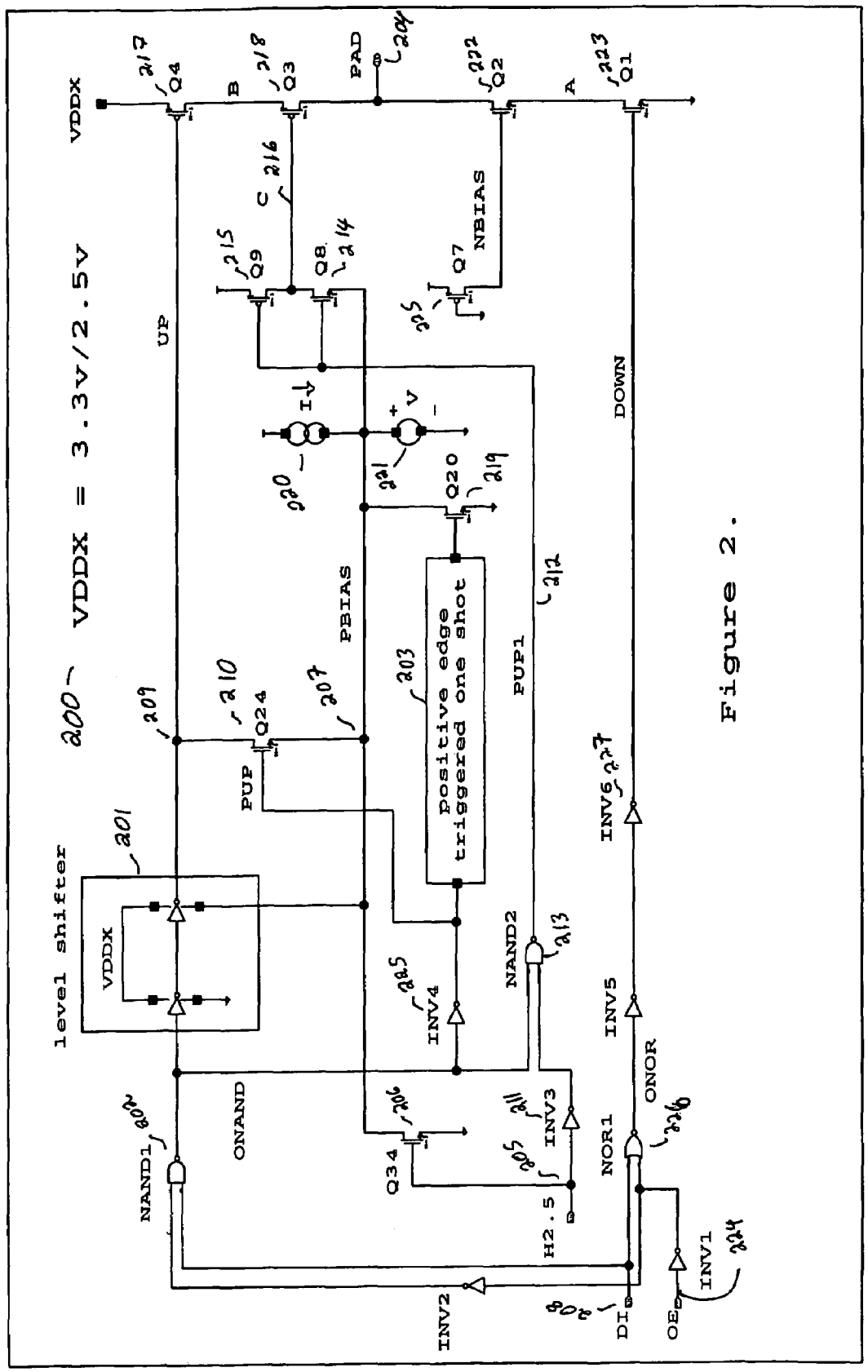
FIG. 2 illustrates a driver circuit according to some embodiments of the present invention.

FIG. 2 illustrates a driver circuit 200 according to some embodiments of the present invention. Driver circuit 200 controls the charging of output pad 204 to VDDX for high and core voltage drive conditions. In the embodiment of driver circuit 200 shown in FIG. 2, the input signal is applied to input node 208 (DI) while an indication of whether VDDX is a high voltage or a low voltage (e.g., 3.3 V or 2.5 V, respectively) is applied to input 205 (H2.5). In some embodiments, a "high" signal is applied to input 205 to indicate a low supply voltage (e.g., 2.5 V) while a "low" signal is applied to input 205 to indicate a high supply voltage (e.g., 3.3 V).

Further, as is illustrated in FIG. 2, driver circuit 200 is supplied with an internal voltage that is independent of the supply voltage and which is less than or equal to the low supply voltage. Further, the low supply voltage is low enough that if the low supply voltage is supplied across the gate oxide of a transistor such as those utilized in driver circuit 200, the transistor is within its design specifications. Further, it is assumed that if the high supply voltage is applied across the gate oxide of a transistor such as those utilized in driver circuit 200, that the design specifications for that transistor may be exceeded.

In some embodiments, an output enable signal (OE) is applied to input 224. In some embodiments, when the output enable signal is "low" the circuit is disabled while if the output enable signal is "high" driver circuit 200 is enabled. If the output enable signal is "low", then the output signal from NAND gate 202 is "high" regardless of the input signal DI applied to 208. Therefore, the signal output from level shifter 201 is high and transistor 210, because of inverter 225, is "off." Therefore, the signal at node 209 is "high" and transistor 217 is "off." The output signal from NAND gate 213 depends on the signal H2.5, resulting in one of transistor 214 or transistor 215 being turned on, providing the gate of transistor 218 with either the internal voltage or a voltage set by current source 220 and voltage supply 221. In which case, whether transistor 218 is turned on or not, because transistor 217 is "off" the voltage between the gate and source, drain, or substrate of transistor 218 does not exceed the voltage design specifications of transistor 218. Further, if a "low" output enable signal is applied to input 224, the output signal from NOR gate 226 is "low". Therefore, although transistor 222 is always "on" because transistor 225 is turned "on," transistor 223 is "off." Therefore, again no voltages beyond the design specification are applied between the gate and source, drain, or substrate of transistors 222 or 223.

For the remainder of the discussion of the embodiment of driver circuit 200 shown in FIG. 2, it is assumed that the output enable signal applied to input 224 is "high." In that case, the output signal from NAND gate 202 depends on the input signal to input 208 and is "low" when the input signal is "high" and "high" when the input signal is "low." Further, the output signal from NOR gate 226 depends on the input signal to input 208 and is "low" when the input signal is "high" and "high" when the input signal is "low."

For low voltage drive conditions (e.g., VDDX at 2.5 V), input 205 is set "high" and transistor 206 is "on," pulling PBIAS node 207 "low." As stated above, when the input signal at input 208 is "high," the output signal from NAND gate 202 is "low." Because of inverter 225, transistor 210 is "on." Further, the output signal from level shifter 201 is pulled low to PBIAS node 207, which is coupled to ground through transistor 206. Additionally, with a steady-state "high" input, the output signal from one-shot 203 is "low" and therefore transistor 219 is "off."

Under those conditions, UP node 209 is pulled "low" to substantially ground by transistor 210 and the output signal from level shifter 201. With input 205 "high" and the output signal from NAND gate 202 low, node 212 (the output signal from NAND gate 213) is "high," turning transistor 214 "on" and transistor 215 "off," coupling node 216 to node 207 which is in turn coupled to ground through transistor 206. Therefore, transistor 217 is "on" with the potential difference between the gate and the source, drain, or substrate of transistor 217 being within the allowable low voltage limits (e.g., 2.5 volts). Transistor 218 is also "on" with the full potential difference of node 216 at the gate against the allowable 2.5 volt potentials of the source, drain, and substrate.

Further, with the input signal at input 208 being "high," the output signal from NOR gate 226 is low and therefore transistor 223 is "off." The gate to source, drain, or substrate voltages in both transistors 222 and 223 are again within the allowable design limits (e.g. 2.5 V).

If the input signal applied to input 208 is "low," then the output signal from NAND 202 is "high" and transistor 210 is "off." Therefore, UP node 209 is "high" and transistors 217 and 218 are "off." Further, the output signal from NAND 213 is "high," turning transistor 215 "off" and transistor 214 "on." Transistor 218, then, is then "on."

Again, the voltages applied between the gate and the source, drain, or substrate of either of transistors 217 and 218 are within the allowable voltage limits in the low-voltage setting (e.g., VDDX=2.5 volts).

When signal H2.5 at input 205 is held "low," indicating that VDDX is at a high voltage (e.g., 3.3 volts), transistor 206 is "off." When the data input node 208 is then held "high," the output signal of NAND 202 is "low," turning transistor 210 on and coupling node 209 to PBIAS node 207. Further, level shifter 201 with a "low" input also drags node 209 low to the voltage level of PBIAS node 207. Again, with a stead-state high input to one-shot 203, the output signal from one-shot 203 is "low" and therefore transistor 219 is "off." Further, the output signal from NAND 213, node 212, is "high," coupling node 216 to node 207 by turning transistor 214 "on" and transistor 215 "off." The potential at node 207 is determined by current source 220 and voltage source 221. The potential at node 207 should be set approximately equal to or higher than the difference in voltage between a high VDDX and a low VDDX but not so high that, when applied to the gate of a transistor, has the effect of a "high" rather than a "low." In some embodiments, the voltage at node 207 can be set, with a high VDDX at 3.3 V and a low VDDX at 2.5 V, at about 0.8 volts. In some embodiments, current source 220 can be disabled to reduce power consumption.

When node 208 is "high," node 209 is driven low to the potential of node 207 by the action of transistor 210 and the output signal from level shifter 201. Nodes 209 and 216 are therefore held at the voltage level of node 207, for example approximately 0.8 volts. The gates of transistors 217 and 218, then, are set at the voltage of PBIAS node 207, or approximately 0.8 volts in this example. Therefore, the gate to source, drain or substrate potentials of transistors 217 and 218 are held within the limits of the 2.5 volt specification of thin gate oxide limits of transistors 217 and 218. Further, the reduced gate drive applied to pull-up transistors 217 and 218 restrains the faster response that may be achieved by the elevated supply VDDX=3.3 volts. Further, the gate voltages to transistors 217 and 218 are still low enough so that transistors 217 and 218 are turned "on."

As discussed above, with an input signal that is "high," transistor 223 is "off." The gate drives on pull down transistors 222 and 223 remain at the internal core voltage for either 2.5 volts or 3.3 volts on VDDX. Further, the gate to source, drain, or substrate voltages of transistors 222 and 223 are within the design specifications for those thin-film transistors.

Because the gates of transistors 222 and 223 are driven at the internal core voltages for either 2.5 or 3.3 volts applied to VDDX, the output fall times for pad 204 are not greatly effected by the differences in VDDX. However, the charge times of PAD 204 in a transition of input signal from "low" to "high" can be dramatically affected by whether a high or a low voltage is applied to VDDX. Driver circuit 200 enhances the charging time for a high-voltage VDDX such that PAD 204 charges to a "high" voltage (i.e., VDDX) in substantially the same time whether VDDX is a high voltage level (e.g., 3.3 V) or a low voltage level (e.g., 2.5 V).

As discussed above, with an input signal at input 208 set at "low," transistors 217 and 218 are both off and transistors 222 and 223 are "on." Also, with the signal H2.5 set to "low," PBIAS node 207 is at an intermediate voltage (e.g., 0.8 V). When the input signal is transitioned from "low" to "high," the input signal to one-shot 203 transitions from "low" to "high" causing one-shot 203 to trigger with a single "high" pulse of short duration. Transistor 219 is then turned "on" momentarily and PBIAS 207 is discharged to ground. Further, node 212 transitions from "low" to "high" such that transistor 215 is turned "off" and transistor 214 is turned "on." Further, a high signal input to one-shot 203 turns transistor 210 on coupling node 209 to node 207. In the time set by the time constant in one-shot 203, transistor 219 is turned "off" and the PBIAS node is returned to the intermediate level (e.g., 0.8 V) set by current source 220 and voltage source 221. The voltages at nodes 209 and 216, which now turn transistors 217 and 218 "on," increase in time such that the potentials across the gate oxides of transistors 217 and 218 do not exceed the design parameters, but also such that transistors 217 and 218 are turned "on" faster than would otherwise be the case.

Figure 3:
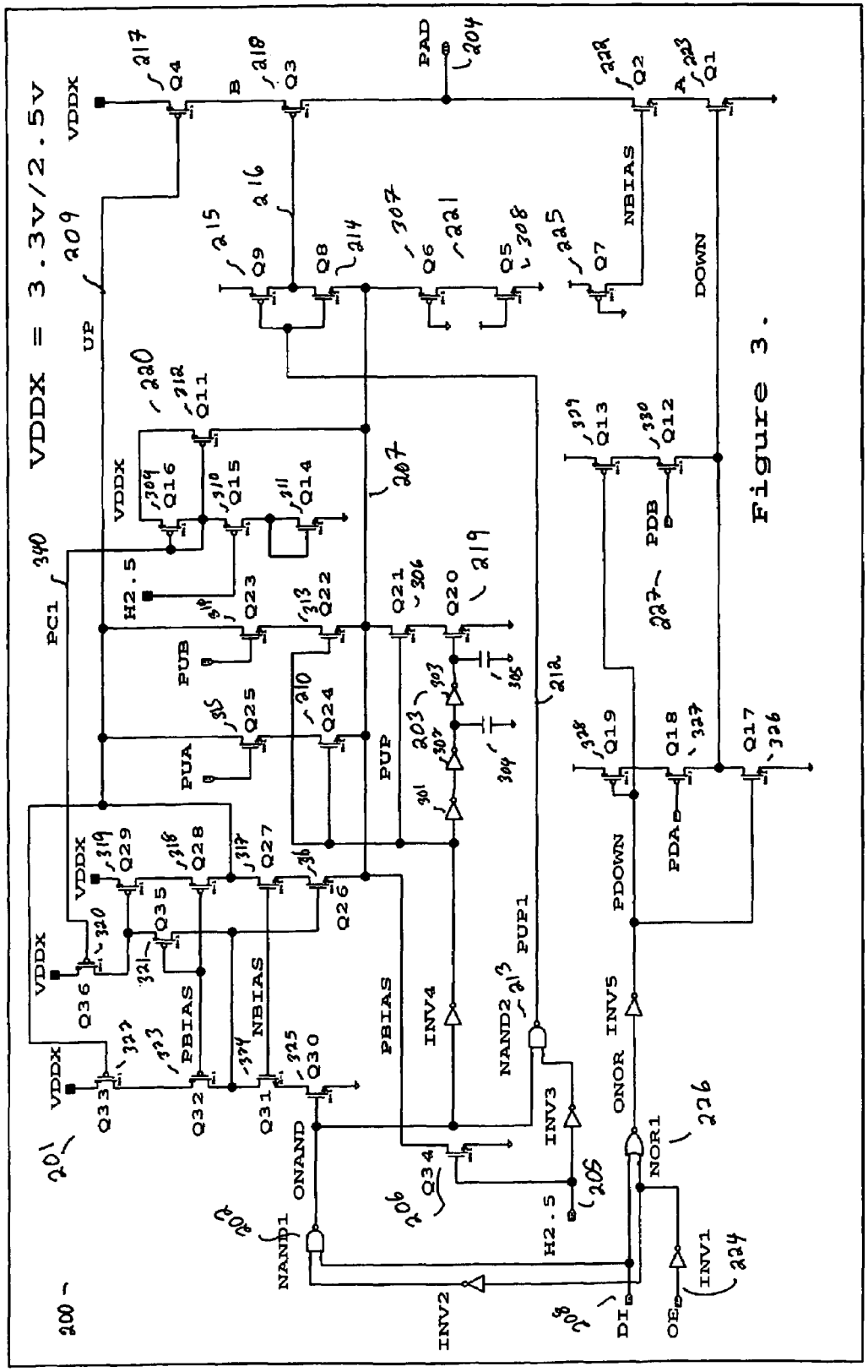
FIG. 3 illustrates a driver circuit according to some embodiments of the present invention.

FIG. 3 illustrates a detailed example of an embodiment of driver circuit 200 according to some embodiments of the present invention. As shown in FIG. 3, detailed examples of level shifter 201 and one-shot 203 are displayed. Further, the output driver section for the case where the input signal at input 208 is "low" is provided. One-shot 203, for example, can include inverters 301, 302, and 303 and capacitors 304, and 305. Further, transistor 306 can be included in series with transistor 219 so that, when the output signal from NAND 202 is "high," transistor 219 is decoupled from PBIAS node 207. Therefore, transistor 219 is only coupled to PBIAS node 207 when the input signal at input 218 is "high." In the transition of input signal from "low" to "high," transistor 306 is turned "on" and transistor 219 is held on, grounding PBIAS node 207, for a duration of time determined by the discharge of capacitors 304 and 305.

Further, voltage source 221 includes transistors 307 and 308. Transistors 307 and 308 create a resistive path between PBIAS node 207 to ground. Current source 220 includes transistors 309, 310, 311, and 312. Transistor 310 is "off" when H2.5 is "high," indicating a 2.5 V supply. Therefore, in the embodiment shown in FIG. 3, current source 220 is on only when the power supply VDDX is at the high voltage (e.g., 3.3 V). When transistor 310 is "on," a current flows through transistor 312 from power supply VDDX, creating a voltage through transistors 307 and 308 at PBIAS node 207.

Transistor 210 is supplemented with transistor 313. Transistors 210 and 313 are coupled to UP node 209 through transistors 315 and 314, respectively. The gates of transistors 315 and 314 are coupled to input signals PUA and PUB, respectively, which are set to a "high" internal voltage.

Level shifter 201, as shown in the embodiment of FIG. 3, includes transistors 316, 317, 318, 319, 320, 321, 322, 323, 324, and 325. Together, these transistors can operate as the two inverters shown as level shifter 201 in FIG. 2 with the "low" of the output inverter coupled to PBIAS node 207. One skilled in the art will recognize that other structures for level shifter 201 can be implemented. For example, a source-follower level shifter can also be utilized as level shifter 201.

Further, in the embodiment of driver circuit 200 shown in FIG. 3, inverter 227 is formed with transistors 326, 327, and 328 and, in the event that the input signal to input 208 is "low," the gate of transistor 223 is driven high by a combination of transistors 328 and 329. Transistors 328 and 329 are coupled to the gate of transistors 223 through transistors 327 and 330, respectively. The gates of transistors 327 and 330 are driven by input signals PDA and PDB, respectively. Both input signals PDA and PDB are "low" when driver circuit 200 is in operation.

Figure 4A:
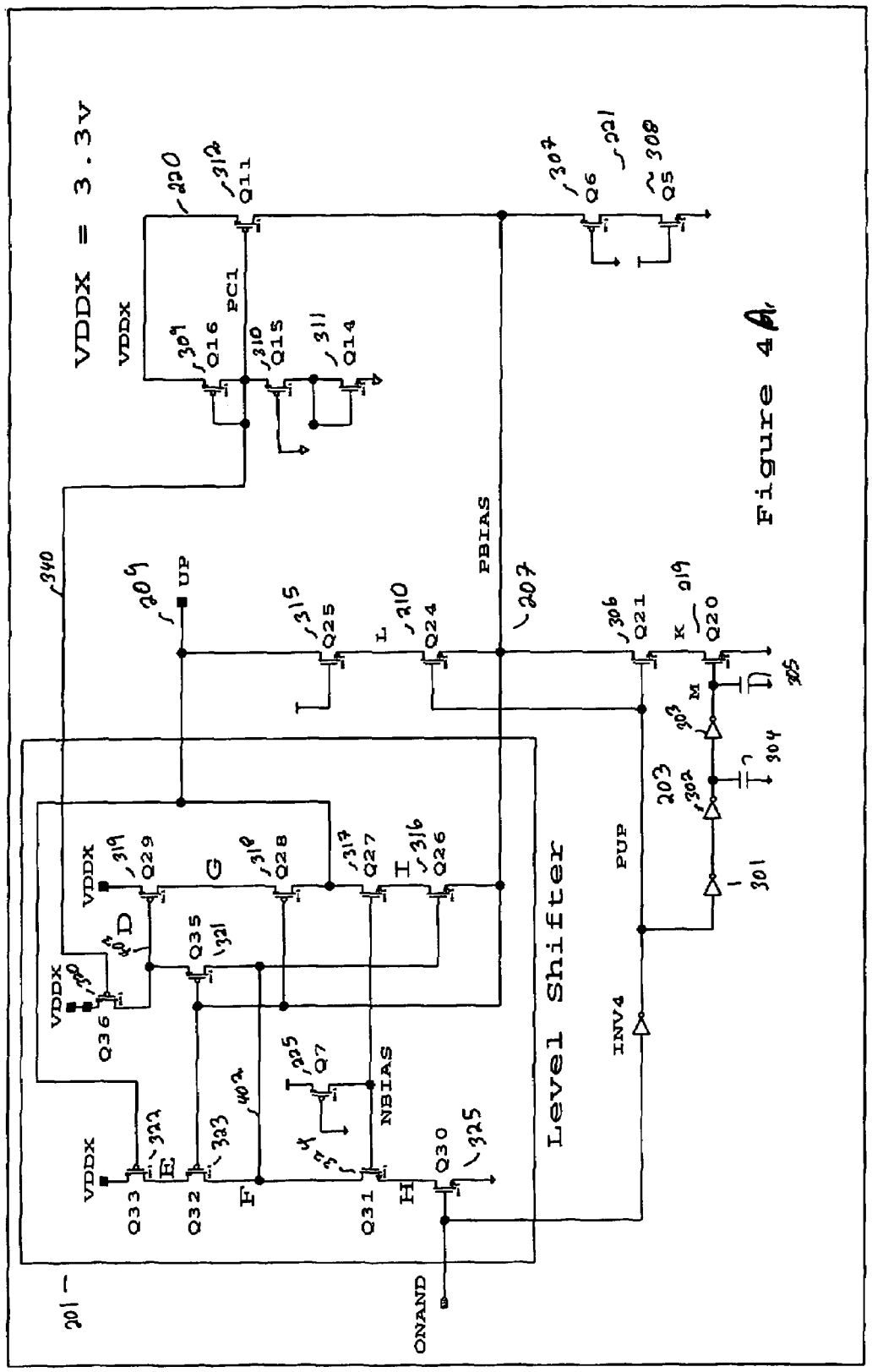
FIG. 4A shows a simplified circuit corresponding to a portion of the embodiment of FIG. 3 for the case when a high power supply voltage is utilized.

FIG. 4A illustrates a simplified version of FIG. 3 in the case where the supply voltage is high (e.g., VDDX=3.3 V) and therefore the signal H2.5 at input 205 is "low." The gate of transistor 310 in current source 220, therefore, is held low and transistor 310 is "on." Node 340 is then biased to a voltage determined by the diode actions of transistors 309 and 311 and the resistance of "on" transistor 310. As is shown in FIG. 4A, node 340 is coupled to both the gate of transistor 312 and the gate of transistor 320.

As is illustrate, both transistors 324 and 317 are "on" because transistor 225 couples their gates to the internal voltage. Further, current source 220 is in operation driving PBIAS node 207 to a low intermediate voltage (e.g., 0.8 V as described above). Therefore, transistors 323, 321, and 318 are "on" because their gates are driven "low."

When the signal ONAND, which is the output from NAND gate 202, is "high," transistor 325 is turned "on" dragging node 402 to ground. Transistor 316 is therefore "off" and node 403 is also pulled to the voltage of node 402, which is "low." Transistor 319 is therefore turned on, coupling the voltage VDDX, "high," to node 209. Further, transistor 322 is turned "off" by the high voltage to its gate. Under those circumstances, node 403 is pulled towards 1.5V set by PBIAS node 207 and transistor 321. Therefore, the design specification of transistor 319 is not violated.

When the signal ONAND is "low," however, transistor 325 is "off." Node 209 is driven toward the voltage on PBLAS 207 through transistors 315 and 210. Therefore, transistors 322 is "on," driving node 402 high towards VDDX. When node 402 is "high," transistor 316 is turned "on" further driving node 209 towards PBIAS node 207. Node 403 is also "high," and therefore transistor 319 is "off."

Transistor 320 protects transistor 319 in the event that node 403 is held at the high supply voltage VDDX. Transistor 320 is turned "on" when the voltage on node 403 exceed the threshold set by the voltage on node 340. When transistor 320 is turned "on," node 403 is pulled towards VDDX, insuring that voltages applied across the gate oxide of transistor 319 do not exceed the design limits of transistor 319.

Figure 4B:
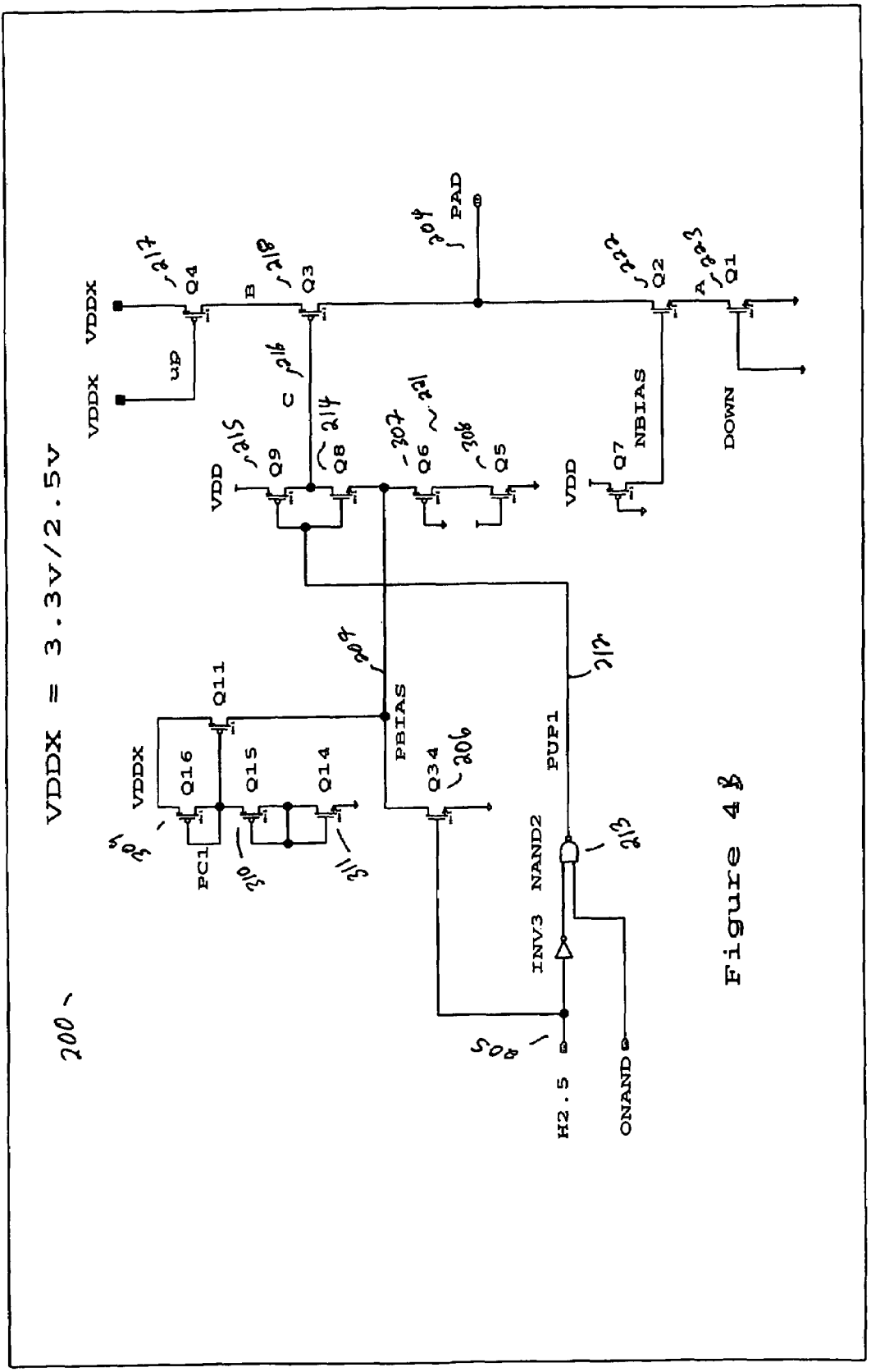
FIG. 4B shows a simplified circuit corresponding to a portion of the embodiment shown in FIG. 3 illustrating the tristate condition.

FIG. 4B illustrates driver circuit 200 in the tristate condition. The tristate condition occurs in the "low" to "high" transition of the input signal to input 208 at the beginning of the charge-up process. In that circumstance, transistors 217 and 223 are both "off." The ONAND signal is "high." When node H2.5 is "high," indicating that VDDX is the low voltage supply (e.g., 2.5 V), PBIAS node 207 is grounded through transistor 206. Transistor 214 turns "on," discharging node 216 to ground. When node H2.5 is "low," indicating that VDDX is at the high voltage (e.g., 3.3 V), node 212 is low turning transistor 215 "on" and charging node 219 to the internal voltage VDD, thus protecting the gates of transistors 216 and 217 when PAD 204 is charged to the externally driven high supply voltage (e.g., 3.3 V).

Figure 5A:
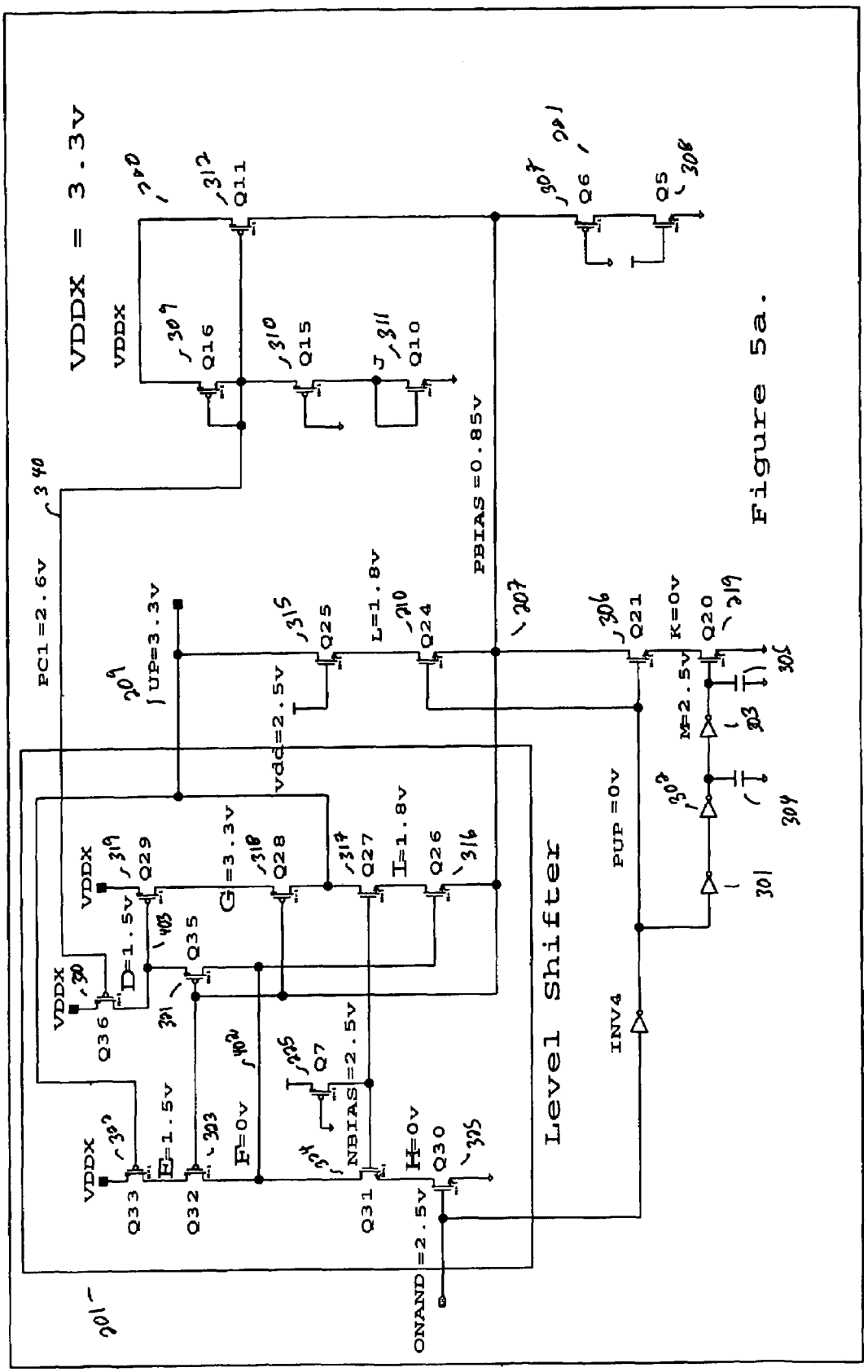
FIGS. 5A and 5B illustrate various voltages of examples of the embodiment shown in FIG. 3 with typical operating voltages and conditions.
Figure 5B:
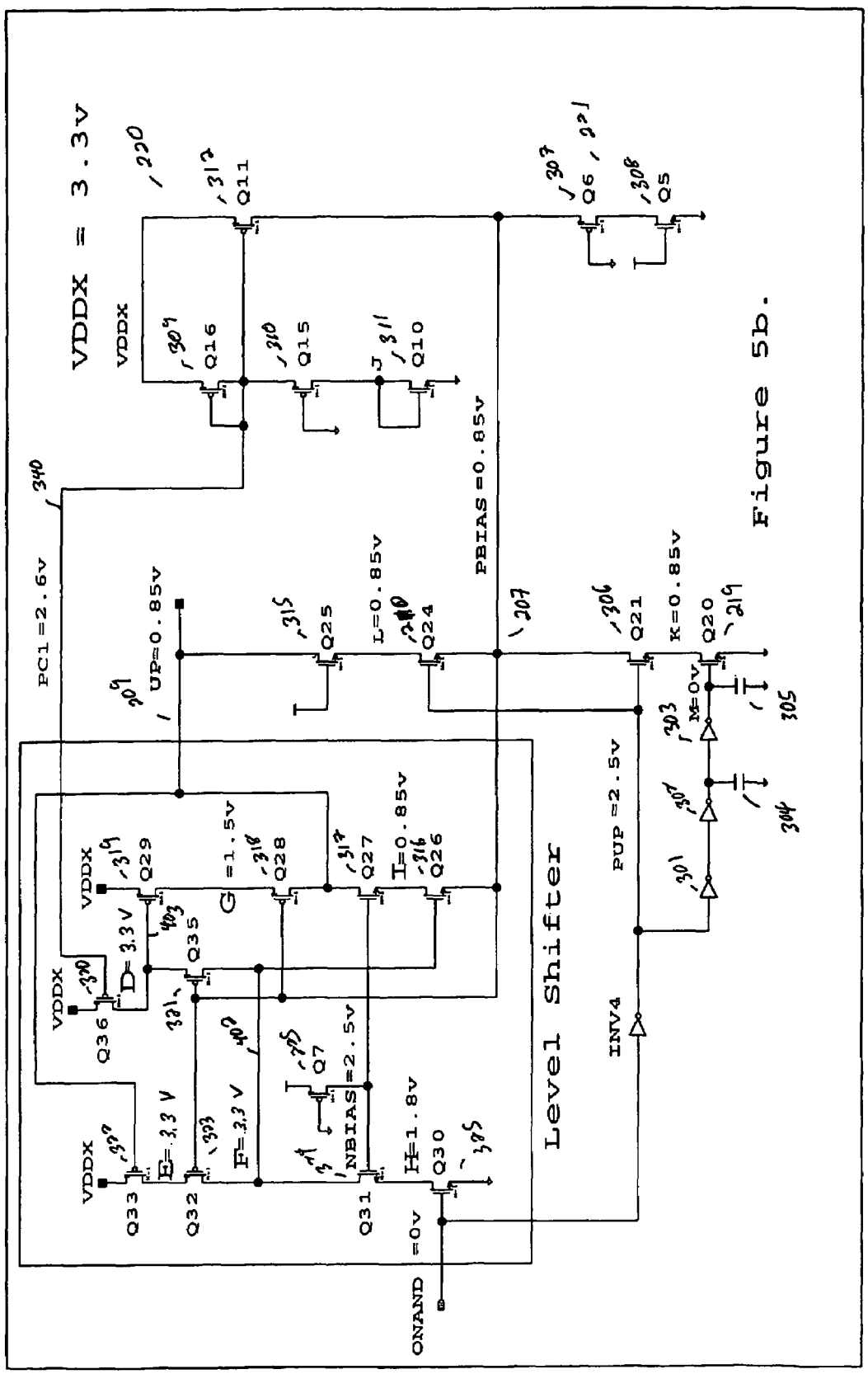

FIGS. 5A and 5B are again simplifications of the embodiment of driver circuit 200 shown in FIG. 3. FIGS. 5A and 5B illustrate that the design limitations of each of the thin gate oxide transistors that form driver circuit 200 are met. FIG. 5A is a simplification of the embodiment shown in FIG. 3 that shows the detailed node voltages in level shifter 201 for the example conditions that VDDX is the high voltage of 3.3 V, the internal core voltage and the low supply voltage is 2.5 V, and the signal ONAND is at a logic "high" of 2.5 V. FIG. 5B is a simplification of the embodiment shown in FIG. 3 that shows the detailed node voltages in level shifter 201 for the example conditions that VDDX is the high voltage of 3.3 V, the internal core voltage and the low supply voltage is 2.5 V, and the signal ONAND is at a logic "low" of 0 V. As can be seen by the voltages shown in FIGS. 5A and 5B, none of the voltages across the gate oxides of the transistors exceeds 2.5 V. In FIG. 5A, for example, the voltage across the gate oxide of transistor 325 is 2.5 V, the voltage across the gate oxide of transistor 324 is 2.5 V, and the voltage across the gate oxide of transistor 323 is 0.85 V. Similarly in FIG. 5B, the voltage across the gate oxide of transistor 325 is 1.8 V and the voltage across the gate oxide of transistor 324 is about 0.8 V.

Embodiments of level shifter 201, therefore, can adhere to the design specifications of the transistors, regardless of whether the high voltage supply (e.g. 3.3 V) or the low voltage supply (e.g. 2.5 V) is utilized. One skilled in the art will recognize that alternative embodiments of level shifter 201, and of driver circuit 200, where the transistors utilized in the circuit do not exceed the design specification of the thin film transistors for operation with either the low voltage supply or the high voltage supply.

Figure 6A:
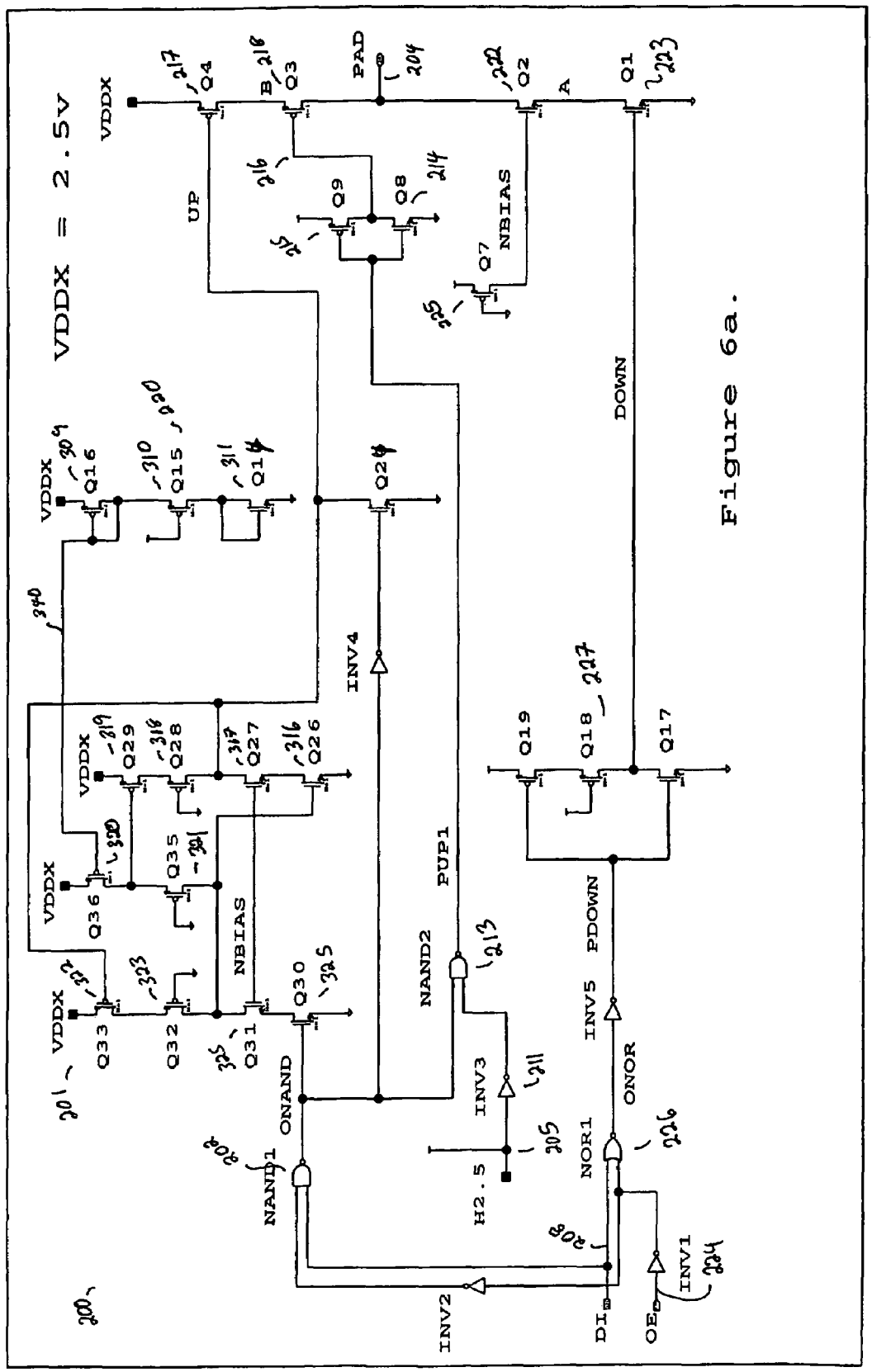
FIGS. 6A and 6B illustrate simplified circuits of the embodiments of FIG. 3 for a low voltage output drive and a high voltage output drive according to some embodiments of the present invention.
Figure 6B:
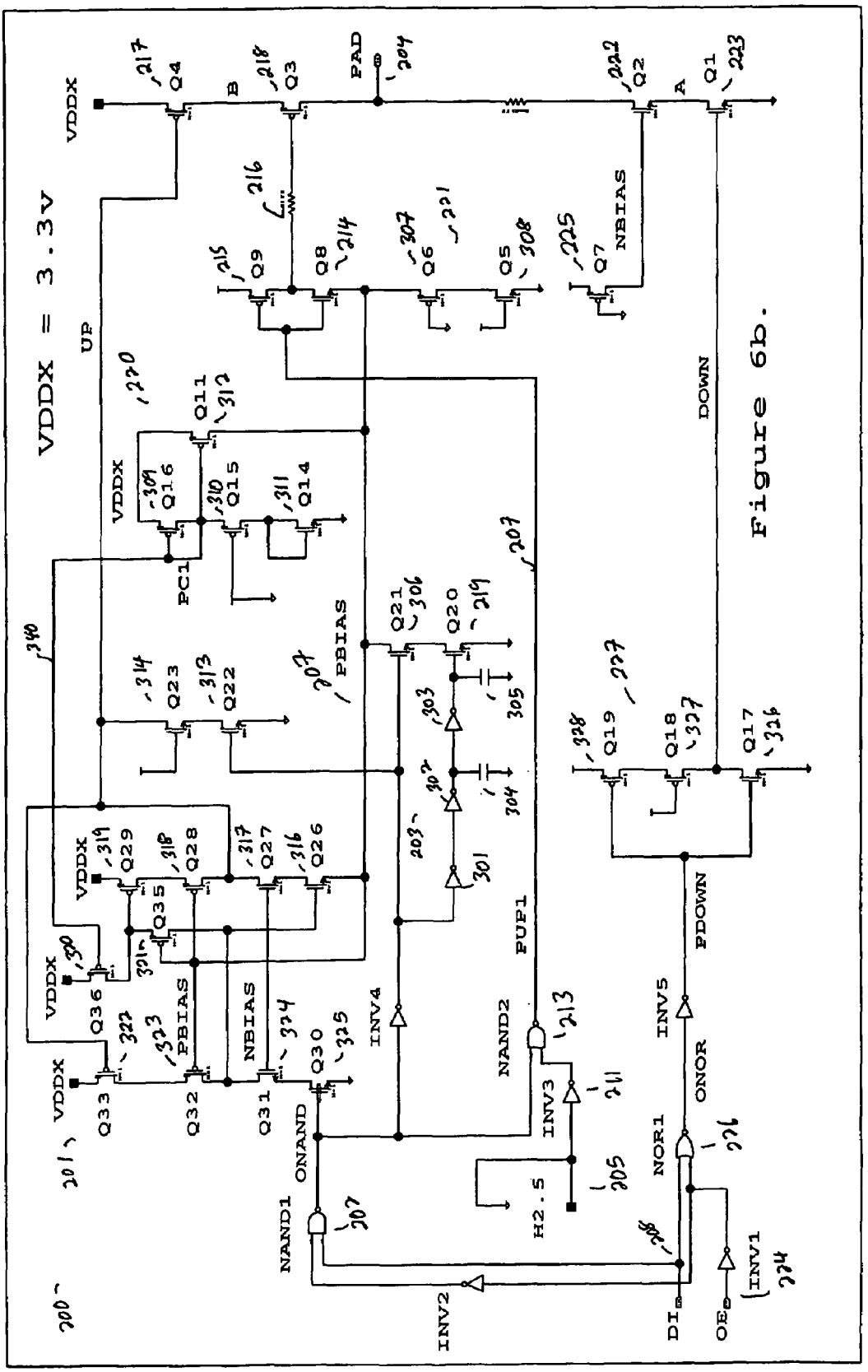

FIGS. 6A and 6B illustrate simplified circuits corresponding to the embodiment of driver circuit 200 shown in FIG. 3. FIG. 6A illustrates a simplified circuit for the case where VDDX is the low power supply voltage (e.g., 2.5 V). FIG. 6B illustrates a simplified circuit for the case where VDDX is the high power supply voltage (e.g., 3.3 V). As shown in FIG. 6A, when VDDX is the low power supply voltage, the input signal H2.5 at node 205 is "high." Therefore PBIAS node 207 is grounded through transistor 206. Further, current source 220 and voltage source 221 are not utilized. FIG. 6B illustrates the simplified circuit for the case where input signal H2.5 is "low," illustrating the case where VDDX is the high supply voltage (e.g., 3.3 V). In this case, current source 220 and voltage source 221 are shown to hold PBIAS node 207 at an intermediate voltage (e.g., about 0.8 V).

Figure 7:
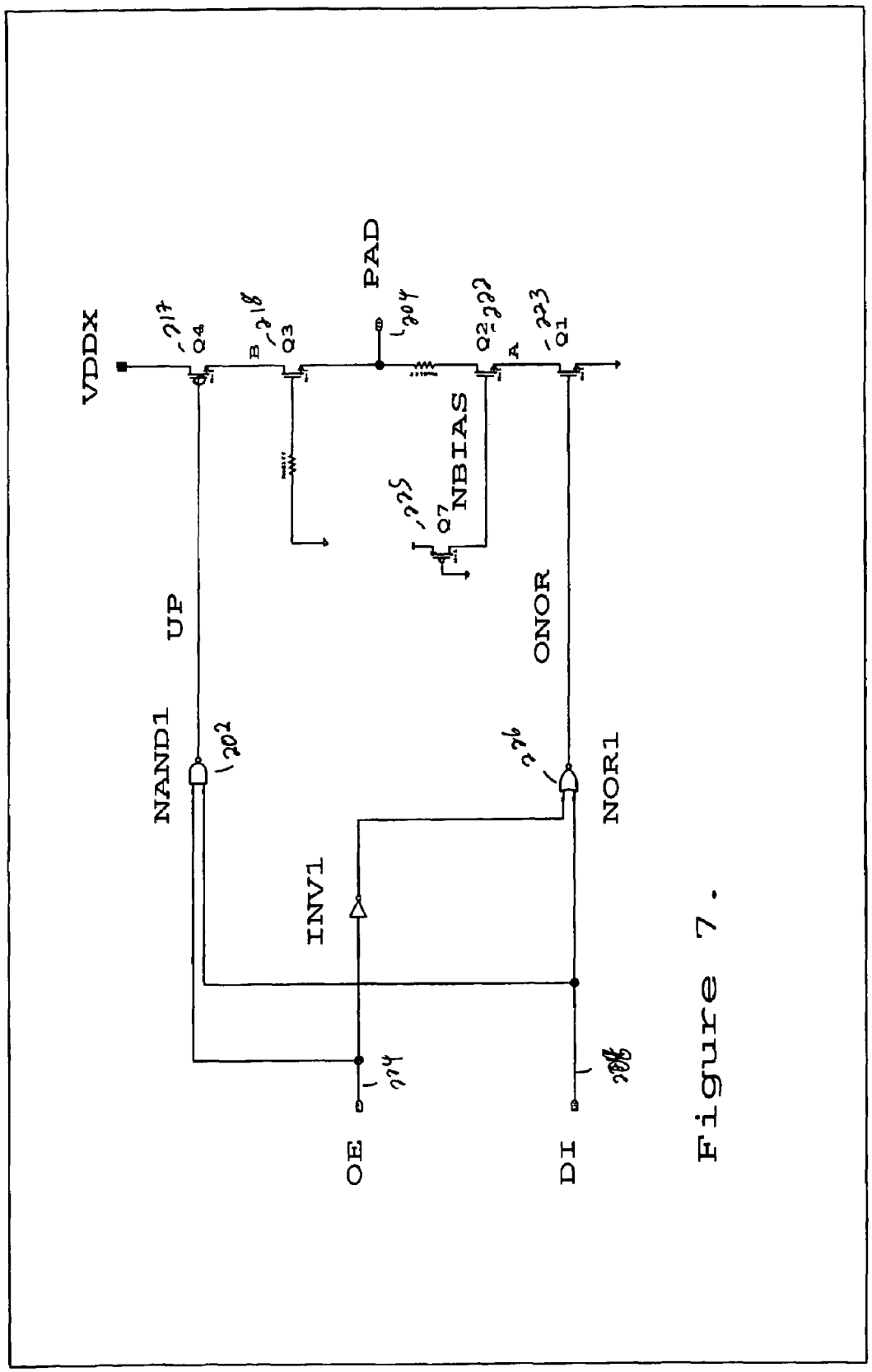
FIG. 7 illustrates an output enable circuit for an output driver according to some embodiments of the present invention.

FIG. 7 illustrates an example output enable circuit that can be utilized in an embodiment of driver circuit 200 according to the present invention. As discussed above, when the output enable signal is "high," the output signal of NAND 202 and NOR 226 depend on the input signal at input 208. However, when the output enable signal is "low," the output signals from NAND 202 is "high" and the output signal from NOR gate 226 is "low" regardless of the input signal applied to input 208.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A method of driving an output voltage, comprising:
providing a bias voltage to a level shifter that is coupled to provide a gate voltage to a first transistor, the first transistor being coupled between a power supply voltage and an output pad, the bias voltage being an intermediate voltage when the power supply voltage is a high voltage and the bias voltage being a ground voltage when the power supply voltage is a low voltage;
generating a signal in the level shifter that is responsive to an input signal for application as the gate voltage of the first transistor;
providing the bias voltage to a control circuit that is coupled to a gate of a second transistor that is coupled between the first transistor and the output pad;
wherein voltages applied to a gate oxide of the first transistor and a gate oxide of the second transistor do not exceed the low voltage.

2. The method of driving an output voltage as in claim 1, further including momentarily grounding the bias voltage in a transition of an input voltage from low to high.

3. The method of driving an output voltage as in claim 1, further including applying a ground to the output pad when a low input signal is provided and charging the output pad when the input signal is a high input signal.

4. The method of driving an output voltage as in claim 1, further including insuring that voltages applied across gate oxides are lower than design limitations.

* * * * *